(12) United States Patent
    LaFrance

(10) Patent No.: US 8,730,042 B2
(45) Date of Patent: May 20, 2014

(54) SYSTEMS AND METHODS FOR DETECTING TAMPERING ASSOCIATED WITH A UTILITY METER

(75) Inventor: Ryan Marc LaFrance, Atlanta, GA (US)

(73) Assignee: General Electric Company, Schenectady, NY (US)

( * ) Notice: Subject to any disclaimer, the term of this patent is extended or adjusted under 35 U.S.C. 154(b) by 288 days.

(21) Appl. No.: 13/253,531

(22) Filed: Oct. 5, 2011

(65) Prior Publication Data

US 2013/0088353 A1    Apr. 11, 2013

(51) Int. Cl.
    *G08B 21/00* (2006.01)
(52) U.S. Cl.
    USPC ....... 340/550; 340/637; 340/870.02; 324/110
(58) Field of Classification Search
    USPC ............... 340/635, 637, 870.02, 551, 552; 324/110
    See application file for complete search history.

(56) References Cited

U.S. PATENT DOCUMENTS

| 5,086,292 A * | 2/1992 | Johnson et al. ............... 340/637 |
| 7,218,223 B2 * | 5/2007 | Seal et al. ..................... 340/551 |

* cited by examiner

*Primary Examiner* — Jeffery Hofsass
(74) *Attorney, Agent, or Firm* — Sutherland Asbill & Brennan LLP

(57) ABSTRACT

Systems and methods for detecting tampering associated with a utility meter. According to one embodiment of the invention, there is disclosed a method. The method can include detecting either a rate of change or change in magnitude of a magnetic field associated with a utility meter; based at least in part on the rate of change or the magnitude of the magnetic field, determining that a magnetic event has occurred; upon or after occurrence of the magnetic event, receiving additional utility meter information; based at least in part on the magnetic event and additional utility meter information, determining that meter tampering has occurred; and generating an event indication for transmission to a utility service or for subsequent review by the utility service.

17 Claims, 3 Drawing Sheets

SYSTEMS AND METHODS FOR DETECTING TAMPERING ASSOCIATED WITH A UTILITY METER

FIELD OF THE INVENTION

Embodiments of the invention relate generally to utility meters, and more particularly, to systems and methods for detecting tampering associated with a utility meter.

BACKGROUND

Magnetic tampering in a utility meter has been a historical problem. Utility meter tampering can lead to inaccuracies in utility measurements by the utility meter causing revenue loss for the associated utility service.

BRIEF SUMMARY OF THE INVENTION

Some or all of the above needs and/or problems may be addressed by certain embodiments of the invention. Certain embodiments may include systems and methods for detecting tampering associated with a utility meter. According to one embodiment of the invention, there is disclosed a method. The method can include detecting either a rate of change or change in magnitude of a magnetic field associated with a utility meter; based at least in part on the rate of change or the magnitude of the magnetic field, determining that a magnetic event has occurred; upon or after occurrence of the magnetic event, receiving additional utility meter information; based at least in part on the magnetic event and additional utility meter information, determining that meter tampering has occurred; and generating an event indication for transmission to a utility service or for subsequent review by the utility service.

According to another embodiment of the invention, there is disclosed a system including a utility meter and a sensor operable to detect a magnetic field associated with the utility meter. The system can also include a processor with computer-executable instructions. The computer-executable instructions can be operable to: detect either a rate of change or change in magnitude of a magnetic field associated with a utility meter; based at least in part on the rate of change or the magnitude of the magnetic field, determine that a magnetic event has occurred; upon or after occurrence of the magnetic event, receive additional utility meter information; based at least in part on the magnetic event and the additional utility meter information, determine that meter tampering has occurred; and generate an event indication for transmission to a utility service or for subsequent review by the utility service.

Further, according to another embodiment of the invention, there is disclosed one or more computer-readable media storing computer-executable instructions that, when executed by at least one processor, configure the at least one processor to perform operations for detecting either a rate of change or change in magnitude of a magnetic field associated with a utility meter; based at least in part on the rate of change or the magnitude of the magnetic field, determining that a magnetic event has occurred; upon or after occurrence of the magnetic event, receiving additional utility meter information; based at least in part on the magnetic event and additional utility meter information, determining that meter tampering has occurred; and generating an event indication for transmission to a utility service or for subsequent review by the utility service.

Other embodiments, systems, methods, apparatus aspects, and features of the invention will become apparent to those skilled in the art from the following detailed description, the accompanying drawings, and the appended claims.

BRIEF DESCRIPTION OF THE DRAWINGS

The detailed description is set forth with reference to the accompanying drawings, which are not necessarily drawn to scale. The use of the same reference numbers in different figures indicates similar or identical items.

DETAILED DESCRIPTION OF EMBODIMENTS OF THE INVENTION

Illustrative embodiments of the invention will now be described more fully hereinafter with reference to the accompanying drawings, in which some, but not all embodiments of the invention are shown. The invention may be embodied in many different forms and should not be construed as limited to the embodiments set forth herein; rather, these embodiments are provided so that this disclosure will satisfy applicable legal requirements. As noted above, like numbers refer to like elements throughout.

Illustrative embodiments of the invention are directed to, among other things, detecting tampering associated with a utility meter. As an overview, certain utility meters can include one or more switches, such as a remote disconnect switch, which can control or cut utility service to an associated premises via a utility service office or other utility management location. One or more magnetic sensors associated with the utility meter can be used to detect the presence of a magnetic field associated with the utility meter. Magnetic sensors may include, but are not limited to, a hall effect sensor, a reed switch, a magnetoresistive sensor or switch, or any combination thereof. When at least one magnetic sensor detects a predefined rate of change or change in magnitude of a magnetic field inside or in the vicinity of the utility meter, a magnetic event can be determined by the utility meter to have occurred. Upon or after occurrence of the magnetic event, additional utility meter information can be received or otherwise collected. In certain instances, meter status information can be used by to confirm whether meter tampering has occurred. For instance, meter status information such as the detection of whether a remote disconnect switch has been switched, or whether average power consumption has decreased over a predefined time period, can be used to determine instances of meter tampering. In this manner, when a magnetic event is detected to have occurred inside or in the vicinity of the utility meter, which in some instances is indicative of utility meter tampering, the utility meter can notify the utility and further action can be taken by the utility and/or the utility meter to further determine or confirm utility meter tampering has occurred.

The technical effects of certain embodiments of the invention may include reducing instances of utility meter tampering, detecting more instances of utility meter tampering earlier and quicker, and reporting such instances in a timely manner to a utility service. Further technical effects of certain embodiments of the invention may include distinguishing between instances of utility meter tampering and other circumstances, which may create, intentionally or unintentionally, a magnetic event associated with a utility meter.

Figure 1:
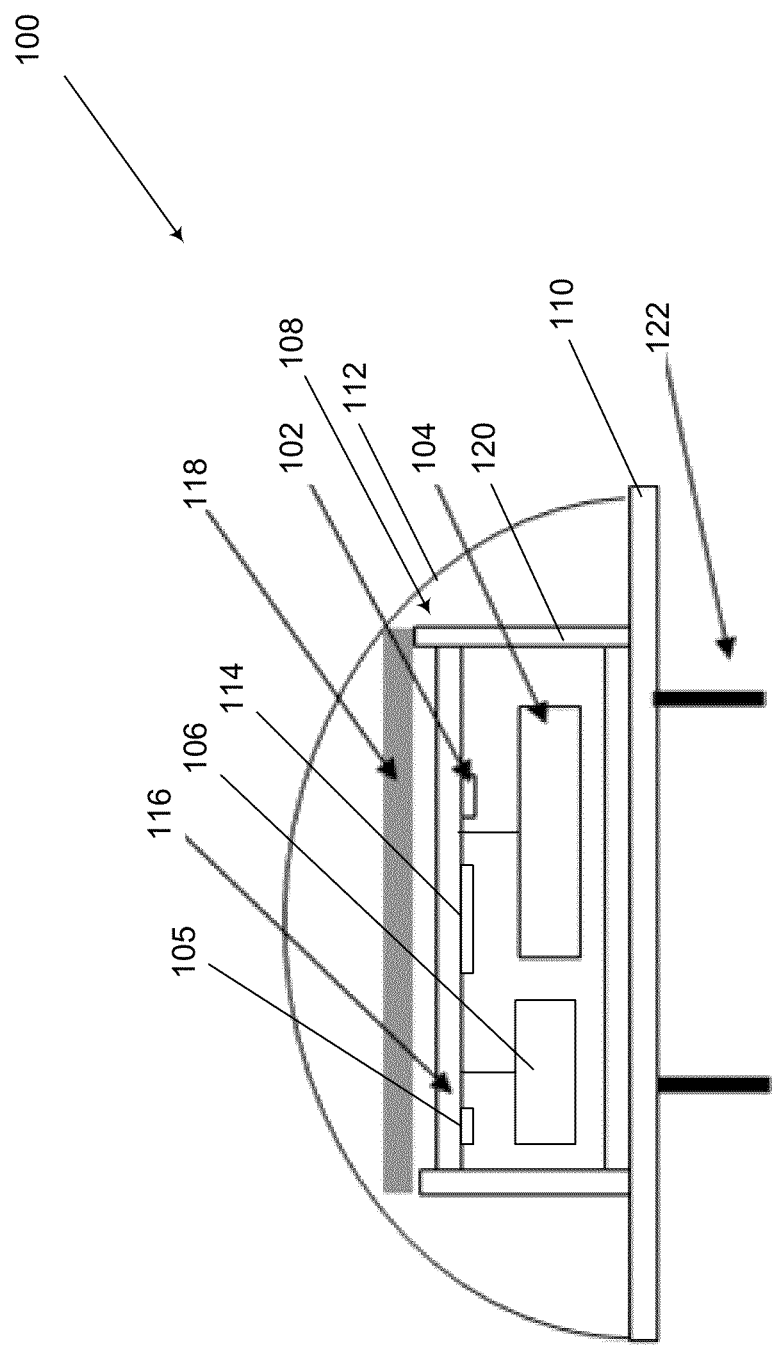
FIG. 1 is a block diagram of an illustrative apparatus or utility meter according to an embodiment of the invention.

FIG. 1 depicts an illustrative utility meter or apparatus 100 in which techniques for detecting tampering associated with a utility meter may be implemented. As shown in FIG. 1, an example apparatus 100 can include a magnetic sensor 102, a remote disconnect switch 104, a current sensor 105, a communication interface 106, a metering component 108, a base 110, a housing 112, and a processor 114. While the embodiment of the invention shown in FIGS. 1 and 2 is tailored for an electrical or power utility meter, one will recognize the applicability of other embodiments of the invention to other types of utilities, such as water, gas, sewer, data, and other measurable services.

In the embodiment shown in FIG. 1, the magnetic sensor 102 can sense or otherwise detect a magnetic event, such as a magnetic field placed within or moved in the vicinity of the metering component 108 or apparatus 100. The magnetic sensor 102 is typically positioned adjacent to the metering component and the remote disconnect switch 104. In certain embodiments, a magnetic sensor can include, but is not limited to, a hall effect sensor, a reed switch, or a magnetoresistive device. In one embodiment, a magnetic sensor can sense or otherwise determine a magnetic event, such as a presence of magnetic field and the magnitude of the magnetic field. In another embodiment, a magnetic sensor can determine, measure, or otherwise sense a magnetic event, such as a rate of change in detected magnetic field. In at least one embodiment, a magnetic sensor can be a series of magnetic sensors located in different locations adjacent to or within the apparatus 100, wherein some of all of the magnetic sensors can be in communication with the communication interface 106 and associated processor, such as 114. In any instance, upon detection of a magnetic event, such as the existence of a magnetic field in the vicinity of the metering component 108 or apparatus 100, the magnetic sensor 102 can communicate information associated with the magnetic field via the communication interface 106 with a processor associated with the metering component 108, such as processor 114, or with a remotely located processor or server.

Figure 2:
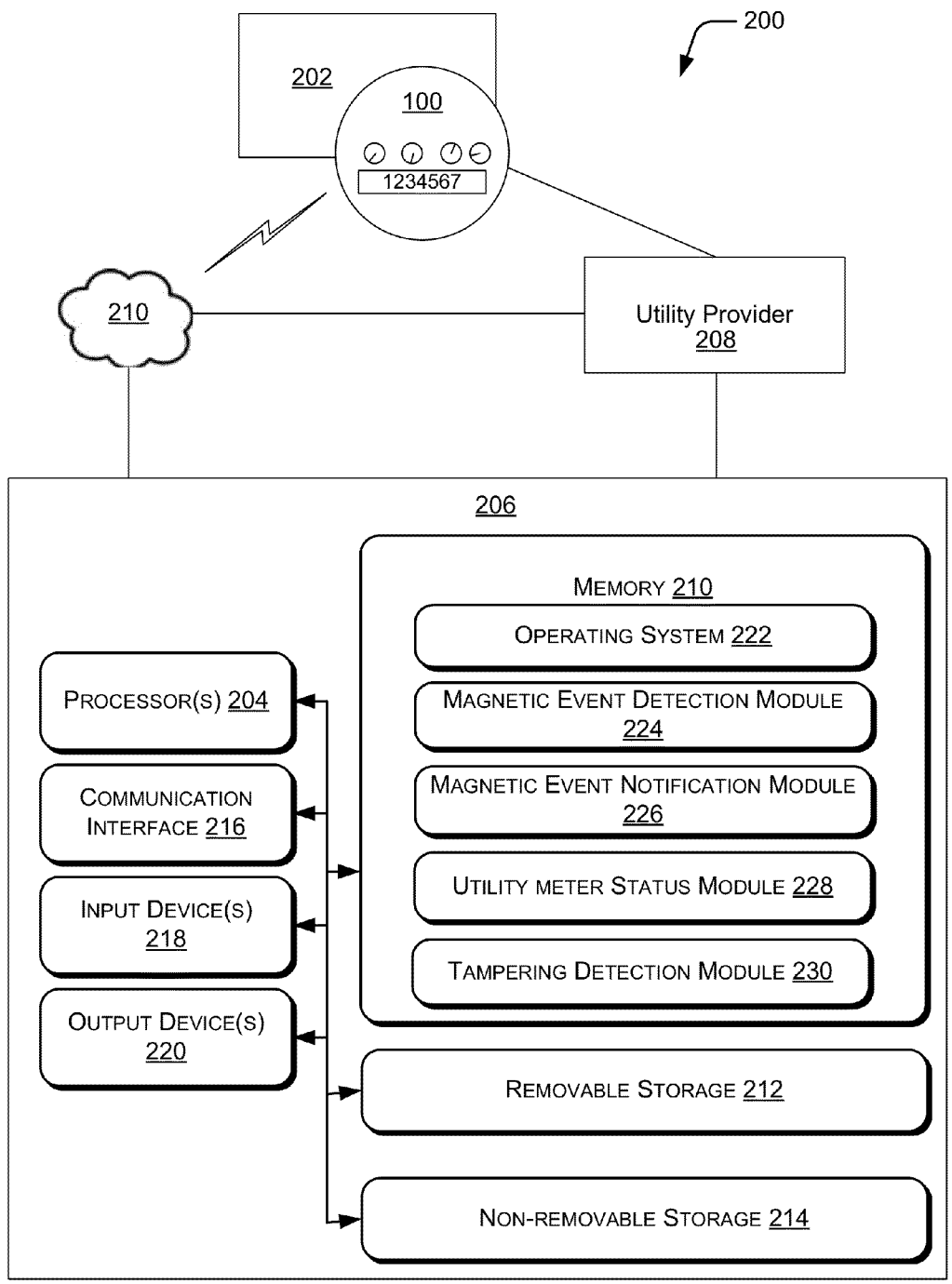
FIG. 2 is a block diagram of an environment showing an illustrative system according to an embodiment of the invention.

FIG. 2 illustrates an example environment or system 200 for the utility meter or apparatus 100 of FIG. 1. In FIG. 2, the apparatus 100 can be located at or otherwise associated with a premises 202, and in communication with a remotely located processor, such as 204, or server, such as 206. In certain instances, the apparatus 100 can be in communication with a utility service, such as 208, or a processor associated with the utility service. FIG. 2 is further described below. Note that a utility service, such as 208, can be a utility company, a utility provider, or an entity, delegate, or person that monitors, controls, administers, or provides a utility or utility service.

Returning to FIG. 1, the remote disconnect switch 104 shown can be operable to control or cut utility service to a premises, such as 202, associated with the apparatus 100. For instance, the remote disconnect switch 104 can be manipulated by a command transmitted by a utility service, such as 208, or with a remotely located processor, such as 204, or server, such as 206. In another instance, the remote disconnect switch 104 can be manipulated by a processor associated with the metering component 108, such as processor 114. In any instance, the remote disconnect switch 104 can be in communication via the communication interface 106 with at least one processor or utility service, which can manipulate the switch 104 to control or cut utility service to a premises, such as 202, associated with the apparatus 100.

In the embodiment shown in FIG. 1, a current sensor, such as a current transformer or rogowski coil, can sense or otherwise detect an electrical current associated with the metering component 108 or apparatus 100. In certain instances, a magnetic event, such as the existence of a magnetic field in the vicinity of the metering component 108 or apparatus 100, may saturate the current sensor 105. The state of the current sensor 105 can be communicated, detected, or otherwise sensed via the communication interface 106 with a processor associated with the metering component 108, such as processor 114, or with a remotely located processor or server.

The communication interface 106 shown in FIG. 1 can be a device operable to facilitate communications between a processor, such as processor 114, associated with the metering component 108, and a remotely located processor, such as 204, a server, such as 206, utility service, such as 208, or a processor associated with the utility service. In certain embodiments, a communication interface 106 can facilitate communications via at least one radio frequency. In another embodiment, a communication interface can facilitate communications via wired and/or wireless communications. In any instance, the communication interface 106 can facilitate or otherwise provide communications between at least two processors, or between a processor and a utility service, such as 208.

In FIG. 1, the metering component 108 can typically include a main meter electronics circuit board 116, a name plate carrier 118, and one or more supports 120 to secure the circuit board 116 and name plate carrier 118 to the base 110. The metering component 108 can include one or more utility measuring devices operable to measure an amount of at least one utility being consumed, used, output, or otherwise being provided to a premises. A utility can include, but is not limited to, power, natural gas, water, data, sewer, or any other measurable item or service provided by or regulated by a utility provider or utility service.

The base 110 shown in FIG. 1 can typically be a relatively flat type component operable to cooperate with the housing 112 to provide an enclosure for one or more components of the apparatus 100. In this embodiment, the base 110 can include one or more terminal blades 122 operable to interface with corresponding utility terminals associated with a premises, such as 202, the apparatus 100 is associated with. One will recognize how the metering component 108 may interface with the one or more terminal blades 122 to measure a utility being consumed, used, output, or otherwise being provided to the premises 202.

As shown in FIG. 1, the housing 112 can typically be an enclosure which cooperates with the base 110 to protect one or more components of the apparatus 100, such as the magnetic sensor 102, remote disconnect switch 104, a current sensor 105, communication interface 106, and metering component 108, from certain environmental conditions, such as moisture or an external force.

The processor 114 is further described below with respect to the description for the processor 204 of FIG. 2. As mentioned above, FIG. 2 provides an example environment or system 200 for the utility meter or apparatus 100 of FIG. 1. The example environment or system 200 may be configured to be a networked computer environment or system, or distributed computer environment or system. While only a single apparatus 100 is shown in FIG. 1, one will recognize that multiple apparatuses, similar to 100, or utility meters, can be in communication with the server 206 and/or utility service 208 by way of a communications network, such as 210. Each of the apparatuses or utility meters can be associated with a respective premises, similar to 202.

In the embodiment shown in FIG. 2, the processor 204 is shown associated with the server 206. The processor 204 can be in communication with a memory 210. The processor 204 may be implemented as appropriate in hardware, software, firmware, or combinations thereof. Software or firmware implementations of the processor 204 may include computer-executable or machine-executable instructions written in any suitable programming language to perform the various functions described. The server 206 may be a computing device, such as a personal computer (PC), handheld or tablet computer, or other processor-based device.

Memory 210 may store program instructions that are loadable and executable on the processor 204, as well as data generated during the execution of these programs. Depending on the configuration and type of environment or system 200, memory 210 may be volatile (such as random access memory (RAM)) and/or non-volatile (such as read-only memory (ROM), flash memory, etc.). The server 206 may also include additional removable storage 212 and/or non-removable storage 214 including, but not limited to, magnetic storage, optical disks, and/or tape storage. The disk drives and their associated computer-readable media may provide non-volatile storage of computer-readable instructions, data structures, program modules, and other data for the computing devices. In some implementations, the memory 210 may include multiple different types of memory, such as static random access memory (SRAM), dynamic random access memory (DRAM), or ROM.

Memory 210, removable storage 212, and non-removable storage 214 are all examples of computer-readable storage media. For example, computer-readable storage media may include volatile and non-volatile, removable and non-removable media implemented in any method or technology for storage of information such as computer-readable instructions, data structures, program modules or other data. Memory 210, removable storage 212, and non-removable storage 214 are all examples of computer storage media. Additional types of computer storage media that may be present include, but are not limited to, programmable random access memory (PRAM), SRAM, DRAM, RAM, ROM, electrically erasable programmable read-only memory (EEPROM), flash memory or other memory technology, compact disc read-only memory (CD-ROM), digital versatile discs (DVD) or other optical storage, magnetic cassettes, magnetic tapes, magnetic disk storage or other magnetic storage devices, or any other medium which can be used to store the desired information and which can be accessed by the server or other computing device. Combinations of any of the above should also be included within the scope of computer-readable media.

However, in other embodiments, computer-readable communication media may include computer-readable instructions, program modules, or other data transmitted within a data signal, such as a carrier wave, or other transmission. However, as used herein, computer-readable storage media does not include computer-readable communication media.

The example environment or system 200 may also contain a communication interface 216 that allows the environment or system 200 to communicate with the apparatus 100, a communication interface 106 associated with the apparatus, a processor 114 associated with the apparatus, a utility service, such as 208, a stored database, another computing device or server, user terminals, and/or other devices on the network 210.

The environment or system 200 may also include one or more input devices 218, such as a keyboard, mouse, pen, voice input device, touch input device, etc., and one or more output devices 220, such as a display, speakers, printer, etc.

Turning to the contents of the memory 210 in more detail, the memory 210 may include an operating system 222 and one or more application programs or services for implementing the features and aspects disclosed herein, including a magnetic event detection module 224, a magnetic event notification module 226, a utility meter status module 228, and a tampering determination module 230. The magnetic event detection module 224 may be configured to receive magnetic sensor information. By way of example only, magnetic sensor information may include a rate of change for or a change in magnitude in a detected magnetic field for a given time period. By way of further example, magnetic sensor information can be data received from or otherwise obtained from one or more of the following: a hall-effect switch, a reed switch, a magnetic sensor, or a magnetoresistive switch to detect the magnetic field. Additionally, the magnetic event detection module 224 may be configured to receive geographic location information of the magnetic sensor, such as the location of the associated apparatus 100, utility meter and/or premises 202. That is, the magnetic event detection module 224 may collect location information from the apparatus 100, so that this information may be used in conjunction with the magnetic sensor information.

In one embodiment, the magnetic event detection module 224 can include one or more predefined thresholds or parameters to compare with one or more measured characteristics or parameters of a detected magnetic field. For instance, in detecting either a rate of change or change in magnitude of a magnetic field associated with a utility meter, the magnetic event detection module 224 can compare a measured rate of change or change in magnitude in a magnetic field to a predefined threshold. In most instances, any background magnetic field associated with the apparatus 100 or utility meter can be measured by the magnetic sensor 102 and accounted for by the magnetic event detection module 224. For instance, a threshold rate of change of at least about 25 gauss per second can be compared to the detected rate of change in a magnetic field. In another instance, a threshold change in magnitude of at least about 50 gauss can be compared to the detected magnitude of change in a magnetic field. In any instance, based at least in part on the rate of change or change in magnitude of the magnetic field, the magnetic event detection module 224 can determine whether a magnetic event has occurred.

In one embodiment, one or more thresholds or parameters to compare with one or more measured characteristics or parameters of a detected magnetic field can be set by or otherwise programmed by a utility service operator or other personnel. For example, a utility service operator can use an input device 218, such as a keyboard, to input a specific rate of change or change in magnitude, which the magnetic event detection module 224 can use as a predefined threshold or parameter to compare with one or more measured characteristics or parameters of a detected magnetic field.

The memory 210 may also include a magnetic event notification module 226. The magnetic event notification module 226 may be configured to communicate a magnetic event indication to a tampering determination module, such as 230. In this instance, the tampering determination module 230 can receive the magnetic event indication and seek additional meter information to determine whether meter tampering has occurred.

In some instances, the magnetic event notification module 226 may be configured to generate and transmit an event indication for transmission to a utility or for subsequent review by the utility. In one instance, upon or after occurrence of a magnetic event, a magnetic event indication, such as an electronic message, can be generated and sent by the magnetic event notification module 226 to the utility service 208 either directly or via a network, such as 210. In another instance, the magnetic event notification module 226 may be configured to set an internal flag, such as in a processor 114, 204, when a magnetic event is detected or otherwise determined by the magnetic event detection module 224.

The memory 210 may also include a utility meter status module 228. The utility meter status module 228 may be configured to communicate with the apparatus 100 or utility meter to monitor and record additional utility meter information, such as activity associated with the metering component 108, the remote disconnect switch 104 and/or current sensor 105, to facilitate a determination whether certain activity associated with meter tampering has occurred. For example, the utility meter status module 228 can record and determine an average utility consumption within a predefined time period, such as 24 hours, after a magnetic event is determined by the magnetic event detection module 224. Determining whether the average utility consumption has changed substantially, such as decreasing substantially, for instance about 20 to 50%, over the predefined time period, can be an indicator of meter tampering. In another example, a state of the remote disconnect switch 104 can be determined to check whether the state of the switch 104 has been changed within a predefined time period, such as the past 24 hours including the time of the detection or determination of a magnetic event by the magnetic event detection module 224. Determining whether the remote disconnect switch 104 has changed state, such as from off to on, within a predetermined time period including the time of the detection or determination of the magnetic event, can be an indicator of meter tampering.

In one embodiment, the meter status module 228 can compare utility consumption, switch states, or other data over different predefined time periods. For example, the utility meter status module 228 can determine an average utility consumption for an initial 15 minute time period, and compare an average utility consumption for another 15 minute time period, beginning an hour after the initial 15 minute time period. Likewise, the meter status module 228 can determine the state of the remote disconnect switch 104 for an initial 5 minute time period, and compare the state of the remote disconnect switch 104 for subsequent 5 minute time periods after the initial 5 minute time period. In other embodiments, other time periods or intervals can be used and compared.

In another embodiment, a meter status module 228 can determine whether one or more current sensors, such as 105, associated with the utility meter are saturated. In certain instances, a current sensor 105, such as a current transformer (CT) or rogowski coil, can become saturated when exposed to a relatively strong magnetic force. The meter status module 228 may be configured to communicate with the apparatus 100 or utility meter to determine whether an associated current sensor is saturated. Information that the associated current sensor is saturated can be an indicator of meter tampering.

In any instance, the utility meter status module 228 can transmit information or otherwise report information associated with average utility consumption, remote disconnect switch states, and/or current sensor saturation states to the utility service 208, a processor 114, 204, or a tampering determination module, such as 230, for subsequent analysis and/or processing. In other embodiments, other apparatus or utility meter information, magnetic sensor information and/or premises information can be determined by or otherwise used by the utility meter status module 228 to determine whether certain activity associated with meter tampering has occurred.

The memory 210 may also include a tampering determination module 230. The tampering determination module 230 can be configured to receive or otherwise obtain an indication of a magnetic event from a magnetic event detection module, such as 224, an apparatus, such as 100, or a utility meter. The tampering determination module 230 can also be configured to receive or otherwise obtain additional meter information, such as information associated with average utility consumption, remote disconnect switch states, and/or current sensor saturation states, which may be indicative of meter tampering. Based at least in part on the indication of a magnetic event and the additional meter information, the tampering determination module 230 can determine whether meter tampering has occurred at the apparatus 100 or utility meter.

For instance, the tampering determination module 230 may determine that meter tampering has occurred at a particular apparatus or utility meter, such as 100, if the tampering determination module 230 receives an indication of a magnetic event associated with an apparatus 100 or utility meter, and also receives a meter status information associated with the apparatus 100 or utility meter indicating that some or all of the following events have occurred: decreased average power consumption in a predefined time period, decreased utility usage in a predefined time period, a change in the average measured utility in a predefined time period, a remote disconnect switch status change from on to off, a remote disconnect switch status change from off to on, or saturation of a current sensor. Upon determination of meter tampering, the tampering determination module 230 can generate and transmit a message or indication to a utility service, such as 208, notifying the utility service 208 that meter tampering has occurred.

In another embodiment, a tampering determination module, such as 230, may set an internal flag, such as in a processor 114, 204, when meter tampering is determined by the module 230. The internal flag may be checked by a utility service 208 by direct or network communication with the processor 114, 204, or tampering determination module 230.

In any instance, a utility service, such as 208, can be notified or otherwise become aware of an instance of meter tampering.

While the embodiment shown in FIG. 2 describes a server 206 with various modules 224, 226, 228, 230 and functionality apart from the utility service 208, one will recognize that certain functionality associated with the server 206 can be distributed to any number and combination of servers, processor-based devices, or the utility service applicability in accordance with other embodiments of the invention.

Various instructions, methods, and techniques described herein may be considered in the general context of computer-executable instructions, such as program modules, executed by one or more computers or other devices. Generally, program modules include routines, programs, objects, components, data structures, etc., for performing particular tasks or implementing particular abstract data types. These program modules and the like may be executed as native code or may be downloaded and executed, such as in a virtual machine or other just-in-time compilation execution environment. Typically, the functionality of the program modules may be combined or distributed as desired in various embodiments. An implementation of these modules and techniques may be stored on some form of computer-readable storage media.

The example apparatus 100 and environment 200 shown in FIGS. 1 and 2 are provided by way of example only. Numerous other apparatuses, utility meters, operating environments, system architectures, and device configurations are possible. Accordingly, embodiments of the invention should not be construed as being limited to any particular apparatus, utility meter, operating environment, system architecture, or device configuration.

Figure 3:
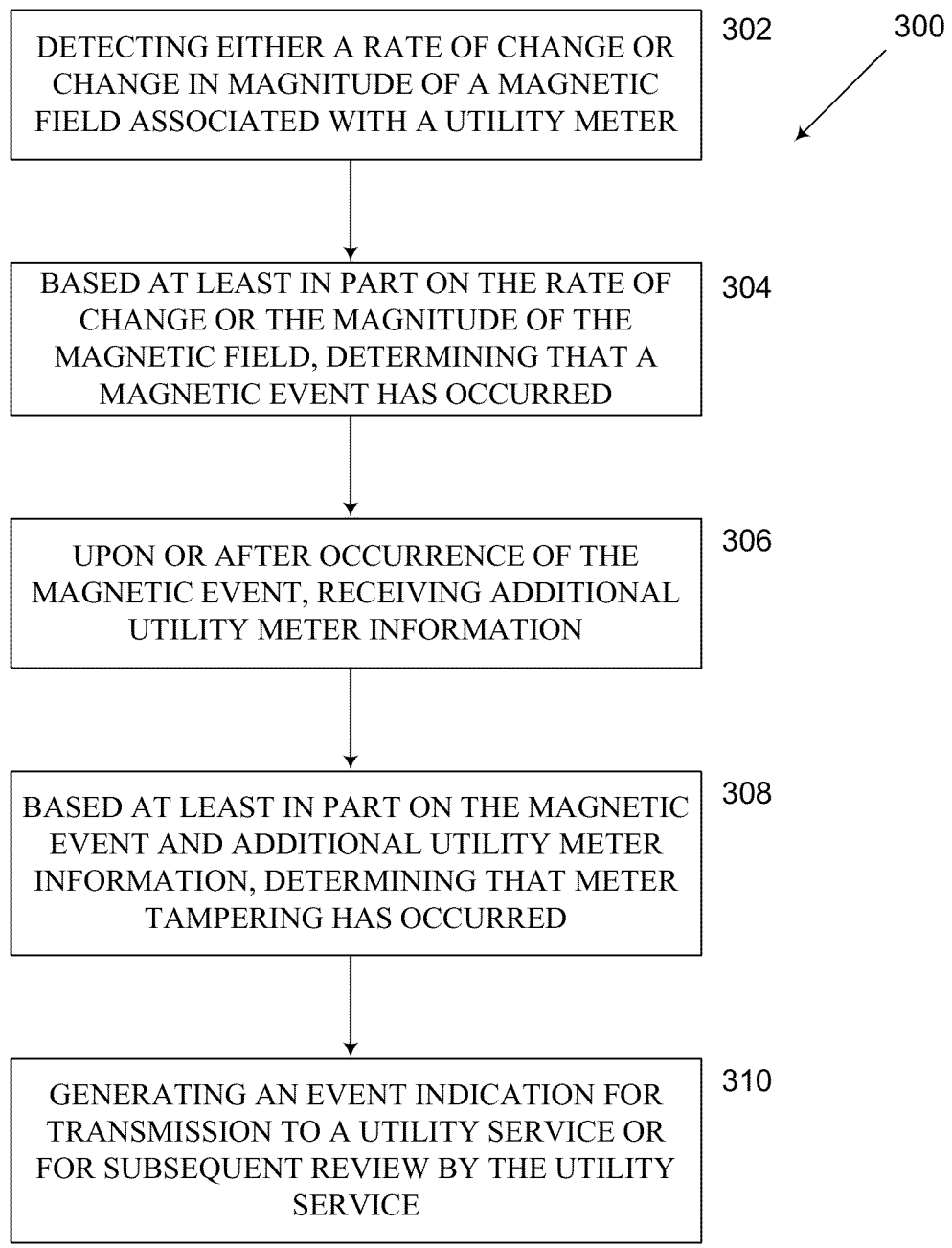
FIG. 3 is a flow diagram illustrating details of a method according to an embodiment of the invention.

FIG. 3 is a flow diagram of an illustrative process 300 for implementing at least one embodiment of detecting tampering associated with a utility meter, as described with reference to FIGS. 1 and 2. In one example, the illustrative apparatus 100 or utility meter, or the example environment and system 200 may perform any, some, or all of the operations of process 300. This process is illustrated as a logical flow diagram, in which each operation represents a sequence of operations that can be implemented in hardware, software, or a combination thereof. In the context of software, the operations represent computer-executable instructions stored on one or more computer-readable storage media that, when executed by one or more processors, perform the recited operations. Generally, computer-executable instructions include routines, programs, objects, components, data structures, and the like, that perform particular functions or implement particular abstract data types. The order in which the operations are described is not intended to be construed as a limitation, and any number of the described operations can be combined in any order and/or in parallel to implement the process.

In this particular implementation, the process 300 may begin at block 302 in which the process 300 may detect either a rate of change or change in magnitude of a magnetic field associated with a utility meter. As noted above, one or more magnetic sensors, such as 102 in FIG. 1, operating in conjunction with a magnetic event detection module, such as 224 in FIG. 2, can detect a rate of change or change in magnitude of a magnetic field associated with a utility meter. At block 304, the process 300 can determine that a magnetic event has occurred based at least in part on the rate of change or the magnitude of the magnetic field received at block 302. At block 306, the process 300 can receive additional utility meter information. After block 306, in block 308, the process 300 can determine that meter tampering has occurred based at least in part on the magnetic event and the additional utility meter information. After block 308, in block 310, the process 300 can generate an event indication for transmission to a utility service 208 or for subsequent review by the utility service.

The process 300 may also determine whether a remote disconnect switch, such as 104 in FIG. 1, has been opened or closed within a predefined period of time. Furthermore, the process 300 may also determine a past utility consumption rate for a premises associated with the utility meter, and determine whether a utility consumption rate in a predefined period of time after the magnetic event changes from the past utility consumption rate. In one embodiment, the process 300 may determine whether a current sensor, such as a current transformer or rogowski coil, is in a saturated state.

The process 300 may end after block 310. In other process embodiments, fewer or greater numbers of operations can be implemented.

Illustrative systems and methods of detecting tampering associated with a utility meter are described above. Some or all of these systems and methods may, but need not, be implemented at least partially by an architecture such as those shown in FIGS. 1-3. It should be understood that certain acts in the methods need not be performed in the order described, may be rearranged or modified, and/or may be omitted entirely, depending on the circumstances. Also, any of the acts described above with respect to any method may be implemented by any number of processors or other computing devices based on instructions stored on one or more computer-readable storage media.

Although embodiments have been described in language specific to structural features and/or methodological acts, it is to be understood that the disclosure is not necessarily limited to the specific features or acts described. Rather, the specific features and acts are disclosed as illustrative forms of implementing the embodiments.

The claimed invention is:

1. A method comprising:
   detecting either a rate of change or change in magnitude of a magnetic field associated with a utility meter;
   based at least in part on the rate of change or the magnitude of the magnetic field, determining that a magnetic event has occurred;
   upon or after occurrence of the magnetic event, receiving additional utility meter information, wherein the additional utility meter information comprises determining whether a disconnect switch has been opened or closed within a predefined period of time;
   based at least in part on the magnetic event and the additional utility meter information, determining that meter tampering has occurred; and
   generating an event indication for transmission to a utility service or for subsequent review by the utility service.

2. The method of claim 1, wherein detecting either a rate of change or change in magnitude of a magnetic field associated with a utility meter comprises using at least one of a hall-effect switch, a reed switch, a magnetic sensor, or a magnetoresistive switch to detect the magnetic field.

3. The method of claim 1, wherein detecting either a rate of change or change in magnitude of a magnetic field comprises detecting a rate of change in the magnetic field greater than about 25 gauss per second.

4. The method of claim 1, wherein detecting either a rate of change or change in magnitude of a magnetic field comprises detecting a change in magnitude of the magnetic field greater than about 50 gauss.

5. The method of claim 1, wherein the event indication comprises at least one of the following: setting an internal flag, or generating an electronic message.

6. The method of claim 1, wherein receiving additional utility meter information further comprises:
   determining a past utility consumption rate for a premises associated with the utility meter; and
   determining whether a utility consumption rate in a predefined period of time after the magnetic event changes from the past utility consumption rate.

7. A system comprising:
   a utility meter;
   a sensor operable to detect a magnetic field associated with the utility meter; and
   a processor with computer-executable instructions operable to:
   detect either a rate of change or change in magnitude of a magnetic field associated with a utility meter;
   based at least in part on the rate of change or the magnitude of the magnetic field, determine that a magnetic event has occurred;
   upon or after occurrence of the magnetic event, receive additional utility meter information, wherein the additional utility meter information comprises determining that a disconnect switch has been opened or closed within a predefined period of time;

based at least in part on the magnetic event and the additional utility meter information, determine that meter tampering has occurred; and generate an event indication for transmission to a utility service or for subsequent review by the utility service.

8. The system of claim 7, wherein the computer-executable instructions operable to detect either a rate of change or change in magnitude of a magnetic field associated with a utility meter comprise using at least one of a hall-effect switch, a reed switch, a magnetic sensor, or a magnetoresistive switch to detect the magnetic field.

9. The system of claim 7, wherein the computer-executable instructions operable to detect either a rate of change or change in magnitude of a magnetic field further comprise computer-executable instructions operable to detect a rate of change in the magnetic field greater than about 25 gauss per second.

10. The system of claim 7, wherein the computer-executable instructions operable to detect either a rate of change or change in magnitude of a magnetic field further comprise computer-executable instructions operable to detect a change in magnitude of the magnetic field greater than about 50 gauss.

11. The system of claim 7, wherein the event indication comprises at least one of the following: setting an internal flag, or generating an electronic message.

12. The system of claim 7, wherein the computer-executable instructions are further operable to:
determine a past utility consumption rate for a premises associated with the utility meter; and
determine whether a utility consumption rate in a predefined period of time after the magnetic event changes from the past utility consumption rate.

13. One or more computer-readable media storing computer-executable instructions that, when executed by at least one processor, configure the at least one processor to perform operations for:

detecting either a rate of change or change in magnitude of a magnetic field associated with a utility meter;
based at least in part on the rate of change or the magnitude of the magnetic field, determining that a magnetic event has occurred;
upon or after occurrence of the magnetic event, receiving additional utility meter information, wherein the additional utility meter data comprises determining that a disconnect switch has been opened or closed within a predefined period of time;
based at least in part on the magnetic event and additional utility meter information, determining that meter tampering has occurred; and
generating an event indication for transmission to a utility service or for subsequent review by the utility service.

14. The computer-readable media of claim 13, wherein the computer-executable instructions that are operable to detect either a rate of change or change in magnitude of a magnetic field further comprise computer-executable instructions operable to detect a rate of change in the magnetic field greater than about 25 gauss per second.

15. The computer-readable media of claim 13, wherein the computer-executable instructions that are operable to detect either a rate of change or change in magnitude of a magnetic field further comprise computer-executable instructions operable to detect a change in magnitude of the magnetic field greater than about 50 gauss.

16. The computer-readable media of claim 13, wherein the event indication comprises at least one of the following: setting an internal flag, or generating an electronic message.

17. The computer-readable media of claim 13, wherein the computer-executable instructions are further operable to:
determine a past utility consumption rate for a premises associated with the utility meter; and
determine whether a utility consumption rate in a predefined period of time after the magnetic event changes from the past utility consumption rate.

\* \* \* \* \*